United States Patent [19]

Schwebel et al.

[11] Patent Number: 4,915,361

[45] Date of Patent: Apr. 10, 1990

[54] RAPID THERMOCHEMICAL TREATMENT AUTOMATIC INSTALLATION

[75] Inventors: Oliver Schwebel, Courcouronnes; Denis Lebeaupin, Charenton, both of France

[73] Assignee: Stein Heurty, RIS Orangis, France

[21] Appl. No.: 248,139

[22] Filed: Sep. 23, 1988

[30] Foreign Application Priority Data

Sep. 24, 1987 [FR] France ........................... 87 13217

[51] Int. Cl.$^4$ ............................................. C21D 9/00
[52] U.S. Cl. .................................... 266/249; 266/274; 432/239
[58] Field of Search ............... 266/249, 274, 287, 250, 266/251, 252; 432/207, 208, 239, 242

[56] References Cited

U.S. PATENT DOCUMENTS 3,238,919 3/1966 Radke et al. ................... 118/49.1
4,646,681 3/1987 Fujiyama ........................ 118/730

FOREIGN PATENT DOCUMENTS

WO87044114 7/1987 European Pat. Off. .
175366 9/1965 U.S.S.R. .
931941 7/1963 United Kingdom .

OTHER PUBLICATIONS

Patent Abstracts of Japan: JP-A-56-274 (Hitachi Seisakusho K.K.) Jan. 6, 1981.

Primary Examiner—Robert McDowell
Attorney, Agent, or Firm—Sandler, Greenblum & Berstein

[57] ABSTRACT

A rapid thermochemical treatment automatic installation for a charge constituted by parts, intended particularly for the mechanical industry, which includes a plurality of treatment modules such as an induction preheating module, thermochemical treatment modules, a quenching module, a device for carrying out the loading and unloading of the parts stacked in columns and a transfer device of the columns of parts between the various treatment modules. The installation includes a fixed circular plate on the periphery of which are distributed various treatment modules, which are suspended beneath the lower surface of the plate, which plate is formed with openings which can be tightly closed for the introduction of the parts to be treated in the respective modules, and a mobile disc rotably and coaxially mounted above the fixed plate, the mobile disc receiving the transfer device so that the transfer device can be brought successively above the loading/unloading station and the access station to the various modules for respectively introducing in the installation a column of parts to be treated, transferring the column of parts to be treated, transferring the column successively to the various modules and extracting from the installation the column of parts after treatment.

16 Claims, 2 Drawing Sheets

RAPID THERMOCHEMICAL TREATMENT AUTOMATIC INSTALLATION

FIELD OF THE INVENTION

The present invention relates to a rapid thermochemical treatment automatic installation of charges constituted by parts particularly intended notably for the mechanical industry.

It is known that in order to increase the hardness and the fatigue strength of such parts, they are subjected to a thermochemical treatment consisting in enriching the material constituting these parts with determined chemical elements such as, for example, carbon or nitrogen, then to cool them according to known cycles.

BACKGROUND OF THE INVENTION

The installations which are generally used for carrying out this type of treatment are generally in the form of continuous lines or of charge ovens in which the heating and thermochemical treatment are carried out within the same enclosure, the quenching being effected by immersion in a vat connected to the thermochemical treatment enclosure via a lock chamber or, the like. Generally, the parts to be treated are placed on plates, in baskets or on mats, and the disadvantage of this handling mode is that the supports for the parts represent easily up to 50% of the total charge of the oven.

In order to remedy the disadvantages met when using such known installations, the assignee of the present application has developed a rapid thermochemical treatment automated installation for parts, particularly for the mechanical industry, which has been the object of French patent No 86 01 13 published under No 2 594 102.

This automated installation includes a plurality of treatment modules for parts such as a preheating module, thermochemical treatment modules, a quenching module, loading means, unloading means and means for providing for the successive transfer of the parts to be treated to the various modules, this installation being characterized in that the parts which have to be treated are stacked into columns, which they are possibly separated by spacers, and in that said columns are delivered by a feeding means to a loading station, the column being then transferred to the first treatment module through a transfer lock chamber and a handling means.

OBJECTS AND SUMMARY OF THE INVENTION

The present invention is an improvement to this installation and allows, in particular, increasing the treatment speed, notably by facilitating the transfer operations of the parts to be treated between the various treatment modules, due to the suppression of the transfer lock chamber and to a new lay-out of the modules and of the means allowing providing for a rapid and reliable transfer between the various modules, as a function of the requirements of the thermochemical treatments to be carried out.

Consequently, the present invention has as an object a rapid thermochemical treatment automatic installation for a charge constituted by parts, intended particularly for the mechanical industry, which includes a plurality of treatment modules such as notably an induction preheating module, thermochemical treatment modules, a quenching module, a means for carrying out the loading and unloading of the parts stacked in columns and a transfer means of said columns of parts between the various treatment modules, this installation being characterized in that it further includes:

a fixed circular plate on the periphery of which are distributed various treatment modules, which are suspended beneath the lower surface of said plate, which plate is formed with openings which can be tightly closed for the introduction of the parts to be treated in the respective modules and a mobile disc rotatably and coaxially mounted above the fixed plate, this mobile disc receiving the transfer means so that said transfer means can be brought successively above the loading/unloading station and the access station to the various modules for respectively introducing in the installation a column of parts to be treated, transferring said column successively to the various modules and extracting from the installation said column of parts after treatment.

According to a feature of this invention, the transfer means is constituted of at least one tight enclosure which is fixed on the mobile disc and which includes a gripping and vertical translation system of the columns of parts.

According to a preferred embodiment of the present invention, the transfer means includes a triple enclosure comprising a first portion, thermally insulated, for receiving the charge during its transfer in the hot state, a second portion which is not insulated and receiving the charge during its transfer in the cold state, and a third portion in which is housed the vertical translation driving system of the columns of parts.

According to a feature of the invention, the loading/unloading means includes at least one loading arm for the piles of parts to be treated or for the parts treated, said arm being imparted with a rotary movement in order to bring the parts underneath the fixed plate in the inlet station of the installation, where they are taken over by the transfer means so as to provide for their transfer to the treatment modules.

According to the invention, the support for the charges, positioned in the transfer means, is imparted with a vertical translation movement via a ball screw driven by a motor so as to transfer the piles of parts between the various modules, the transfer being carried out by the rotation of the mobile disc supporting the transfer means, the pile of parts being positioned in the tight enclosure of the transfer means, during these operations.

BRIEF DESCRIPTION OF DRAWINGS

Other features and advantages of the present invention will become more apparent from the description which follows with reference to the accompanying drawings illustrating a non-limiting embodiment thereof, wherein.

DETAILED DESCRIPTION OF THE INVENTION

Figure 2:
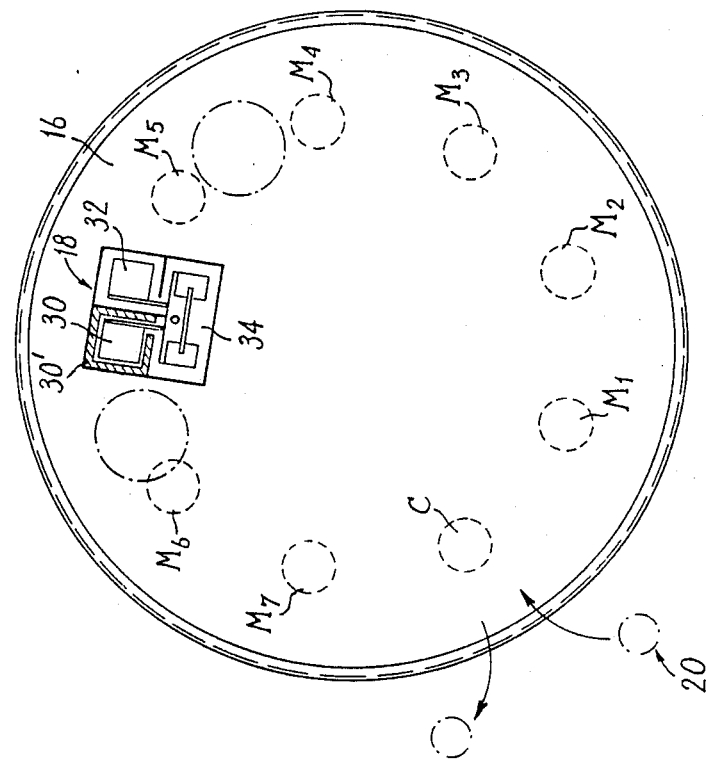
FIG. 2 is a plan view of FIG. 1.
Figure 1:
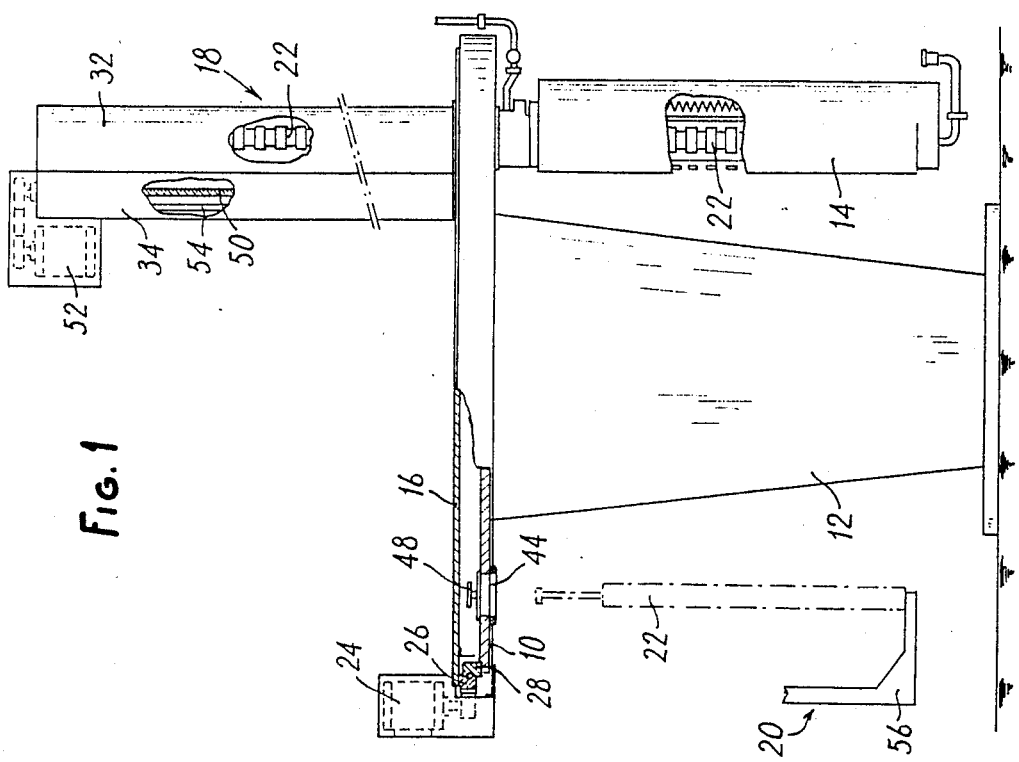
FIG. 1 is a view in elevation and partial vertical section of a preferred embodiment of the invention according to the installation.

With reference to the drawings, the installation which is the object of this invention includes substantially a fixed circular plate 10 supported by a pedestal 12 maintained on the ground and a plurality of treatment modules 14 which are disposed underneath the lower surface of the fixed circular plate 10 to which they are suspended by standard means which will not be described here. Above and coaxially to this fixed circular plate 10 is mounted a rotary circular disc 16 supporting the transfer means 18 with which are effected, on the one hand, the loading and unloading of the parts to be treated, and on the other hand the transfer of these parts between the various treatment modules. The installation includes further a loading/unloading system designated as a whole by reference numeral 20. As is shown in the drawing, this loading/unloading system 20 is constituted here by an arm 56 designed in such manner as to receive the parts which are treated in batches. Each batch is made of a pile 22 of parts, which may be separated by spacers, on support columns, in the manner described in the hereabove mentioned French patent. Of course, the installation includes moreover a preparation and dismounting station for the piles of parts. Since this station is of a known type, it will not be described here.

According to the invention, one can provide a loading arm for the piles of parts in the inlet station of the treatment installation and a second identical arm for the unloading of the piles of parts exiting from the treatment installation. Of course, these two functions can be afforded by a single arm. One may also use a manipulator combining these two functions with those of the preparation and dismounting of the piles of parts.

The various treatment modules such as 14 can include for example: an induction preheating module, in which the parts are brought to the treatment temperature;

six thermochemical treatment modules in which the parts are subjected to a cycle of case hardening, diffusion and a quenching module in which the parts are cooled down, for example, by a circulation of a gazeous fluid, for example nitrogen which maybe under pressure.

In FIG. 2, these various modules have been designated by references M1 to M7. For more details, one can refer to the description of the hrereabove mentioned French patent.

The mobile disc 16 which receives the transfer means 18 is driven in rotation about its axis by a motor 24 entraining a toothed circular crown 26. A seal system 28 provides for the tightness with respect to the installation and allows maintaining under a neutral gas or under a partial vacuum the enclosure constituted by plate 10 and disc 16.

The transfer means 18 is in the form of an enclosure which is fixed on the mobile disc 16, and in this non-limiting embodiment, this treatment enclosure is constituted by a triple chamber including three portions:

a first portion 30 thermally insulated by a lining 30' and receiving the charge 22 during its transfer in the hot state, said insulation 30' allowing limiting the heat losses of the transported charge, while providing for the protection of the driving mechanism situated in the third hereafter described portion;

a second portion 32, which is not insulated and is intended for receiving the charge during its transfer in the cold state, and a third portion 34 housing the mechanism used for the vertical translation of the charges 22 in the hereafter described manner.

According to the invention, there is provided an appendant system (not shown in the drawings) which is positioned near the transfer means 18 and is designed in such manner as to provide for an immediate closing of the module which has just been unloaded so as to avoid heat losses.

In this embodiment, the mechanism which provides for the translation of the charges includes a driving motor 52, a charge support 36 comprising a gripping member 38 for gripping the column of parts 22 in the hereafter described manner, said support 36 being driven in vertical translation by a ball screw 50 driven by motor 52, the guiding being provided by a vertical rod 54.

Figure 3:
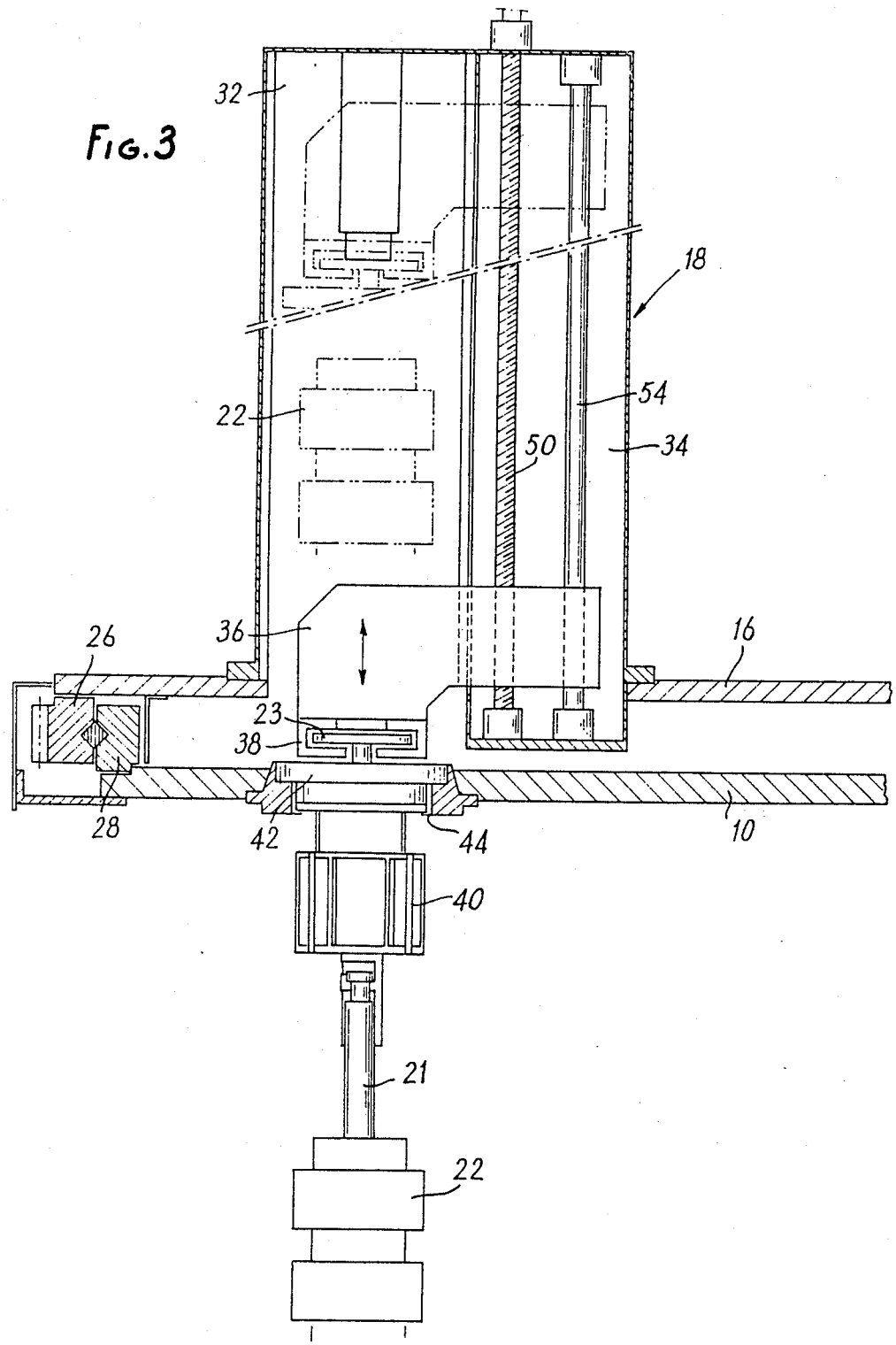
FIG. 3 is a view at a larger scale showing a preferred embodiment of the means providing for the transfer of the parts to be treated.

As seen in FIG. 3, the column 22 of parts to be treated, which are stacked on the support column 21, is handled, for its transfer between the various modules, by support 36, via the gripping member 38 of said support, which can come in engagement with a member 23 rigidly connected to a closing plug 42 mounted at the end of support 40 of pile 22.

The operation of this installation is as following:

The parts, once they are stacked on their support column 21, form batches 22 which are successively brought to the loading station C by the loading arm 56. Opposite batch 22 thus brought in front of the installation is provided a loading orifice 44 formed in the fixed circular plate 10 supporting the various treatment modules such as 14, said loading orifice 44 being normally closed by a closing member such as 48. The rotation of the mobile disc 16 due to motor 24 driving the toothed crown 26 allows bringing the transfer means 18 below opening 44. The control of motor 52 allows lowering the support arm 36 and its gripping member 38 so that the latter grips the batch 22 of parts to be treated, as shown in FIG. 3. This batch of parts is then transferred by the transfer means 18 to the preheating station once the charge 22 has been positioned inside the enclosures 32 or 30 provided in the transfer means 18, due to the displacement in translation upwardly of support 36 under the effect of motor 52, and after rotation of mobile disc 16 so as to bring the transfer means 18 opposite the opening providing an access to the preheating module. The charge can be then transferred in the same manner to the various thermochemical treatment modules, then to the quenching module. The unloading of the column of parts forming the charge 22 is carried out in the same manner as the loading, the operation mode of the transfer means 18 and of the unloading arm being effected in a direction reverse to that hereabove described for the loading.

By way of example, there is indicated hereafter a typical treatment cycle carried out in an installation according to the invention.

This cycle is the following:
preheating at 920° C.
| | |
|---|---|
| case hardening under a low pressure at 920° C. | 5 mn |
| diffusion under vaccum at 920° C. | 4 mn |
| case hardening under a low pressure at 920° C. | 3 mn |
| diffusion | 19 mn |
| gas quenching | |

The installation which operates according to this cycle allows treating 200 parts per hour, each column including 20 parts each.

Also by way of example, there is indicated hereafter a typical production cycle of an installation according to the invention comprising six case hardening stations, a preheating station and a quenching station. The flux balance between the various treatment steps leads to the following dwelling times:

| Dwelling time | Preheating | 5 mn |
|---|---|---|
| | Case hardening | 33 mn 45 s |
| | Quenching | 5 mn |
| | Transfer enclosure | 1 mn 15 s |
| Total dwelling time in the installation | | 46 mn |
| Time needed for the transfers | | 1 mn |
| Time between two loading operations | | 5 mn 45 s |

When using the installation according to the invention, it can be seen that between the liberation of a module and its occupation by a new charge there are three transfers, viz. 45 seconds. Thus, the occupation rate of the modules are respectively 85% for the quenching and preheating modules and 98% for the case hardening modules.

It can be seen that the installation which is the object of the present invention is characterized by a considerably improved productivity as compared with the installations according to the prior art, and this being due particularly to the reduction of the transfer times resulting from the novel characteristics of the transfer means 18 and also from the new lay-out of the various treatment modules.

Of course, the present invention is by no means limited to the various embodiments described and shown here, and it encompasses all the variants thereof.

We claim:

1. A treatment apparatus for parts comprising:
   (a) a fixed plate including at least one treatment module suspended from the lower surface thereof, and a loading station, said fixed plate including at least one opening for the introduction of parts to be treated into the at least one treatment module;
   (b) a movable plate being mounted above and movable relative to said fixed plate; and
   (c) transfer means mounted on said movable plate, whereby said movable plate is moved to bring the transfer means successively above the loading station and said at least one opening for introducing the parts to be treated into said at least one treatment module.

2. The treatment apparatus according to claim 1, wherein said movable plate is rotatable relative to said fixed plate.

3. The treatment apparatus according to claim 1, including a plurality of treatment modules.

4. The treatment apparatus according to claim 1, further including means to tightly close said at least one opening.

5. The treatment apparatus according to claim 1, wherein said at least one treatment module and said transfer means are constructed to handle columns of parts.

6. The treatment apparatus according to claim 1, wherein said transfer means includes an enclosure mounted on said movable plate and means for moving the parts into said enclosure.

7. The treatment apparatus according to claim 6, wherein said enclosure includes a first portion that is thermally insulated for receiving the parts, a second portion for receiving the parts, and a third portion having drive means for driving the means for moving the parts.

8. The treatment apparatus according to claim 6, wherein said means for moving the parts includes gripping means.

9. The treatment apparatus according to claim 6, wherein said means for moving the parts is vertically movable in said enclosure.

10. The treatment apparatus according to claim 9, including drive means for driving the means for moving the parts.

11. The treatment apparatus according to claim 10, wherein said drive means includes a screw driven by a motor, said means for moving the parts being driven by said screw.

12. The treatment apparatus according to claim 1, wherein said loading station includes an opening in said fixed plate.

13. The treatment apparatus according to claim 12, wherein the parts are also unloaded through said opening at said loading station.

14. The treatment apparatus according to claim 12, further comprising a loading arm to introduce the parts through the opening at said loading station to be transferred to said transfer means.

15. The treatment apparatus according to claim 14, wherein the parts are also unloaded through said opening at said loading station, said loading arm also unloading said parts.

16. The treatment apparatus according to claim 14, wherein said loading arm is rotatable to bring the parts beneath said fixed plate.

* * * * *

UNITED STATES PATENT AND TRADEMARK OFFICE
CERTIFICATE OF CORRECTION

PATENT NO. : 4,915,361

DATED : April 10, 1990

INVENTOR(S) : O. Schwebel et al

It is certified that error appears in the above-identified patent and that said Letters Patent is hereby corrected as shown below:

```
column 1, line 8, delete "notably";
column 1, line 24, delete "," after "or";
column 1, line 43, delete "they";
column 3, line 10, after "hand" insert ---,---;
column 3, line 41, after "example" insert ---,---;
column 3, line 41, change "maybe" to ---may be---; and,
column 4, line 22, change "following" to ---follows---.
```

Signed and Sealed this

Eighth Day of October, 1991

*Attest:*

HARRY F. MANBECK, JR.

*Attesting Officer*      *Commissioner of Patents and Trademarks*